(12) United States Patent
Negro et al.

(10) Patent No.: US 7,407,896 B2
(45) Date of Patent: Aug. 5, 2008

(54) CMOS-COMPATIBLE LIGHT EMITTING APERIODIC PHOTONIC STRUCTURES

(75) Inventors: Luca Dal Negro, Cambridge, MA (US); Jae Hyung Yi, Cambridge, MA (US); Jurgen Michel, Arlington, MA (US); Yasha Yi, Cambridge, MA (US); Victor T. Nguyen, Walnut, CA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 270 days.

(21) Appl. No.: 11/113,624

(22) Filed: Apr. 25, 2005

(65) Prior Publication Data

US 2005/0255619 A1 Nov. 17, 2005

Related U.S. Application Data

(60) Provisional application No. 60/565,164, filed on Apr. 23, 2004, provisional application No. 60/564,900, filed on Apr. 23, 2004, provisional application No. 60/631,041, filed on Nov. 24, 2004.

(51) Int. Cl.
  *H01L 21/31* (2006.01)
  *H01L 21/469* (2006.01)
(52) U.S. Cl. ............... 438/787; 438/624; 438/38
(58) Field of Classification Search ........... 438/624, 438/663, 38, 496, 775, 787, 958, FOR. 157
See application file for complete search history.

(56) References Cited

U.S. PATENT DOCUMENTS

| | | | |
|---|---|---|---|
| 5,643,823 A * | 7/1997 | Ho et al. ............ | 438/421 |
| 6,552,361 B1 * | 4/2003 | Lu et al. ............ | 257/59 |
| 6,603,558 B2 | 8/2003 | Murakowski et al. | |
| 6,775,448 B2 | 8/2004 | Zoorob | |
| 6,859,582 B2 | 2/2005 | Cai et al. | |
| 6,868,107 B2 | 3/2005 | Vurgaftman et al. | |
| 6,962,728 B2 * | 11/2005 | Lung et al. ........ | 427/255.29 |
| 2002/0163003 A1 | 11/2002 | Dal Negro et al. | |

OTHER PUBLICATIONS

"Nanocrystalline-Silicon Superlattice Produced by Contolled Recrystalization," Tsybeskov et al., *Applied Physics Letters*, v. 71, n. 1 (Jan. 5, 1998).

"Modeling and Perspectives of the Si Nanocrystals—Er Interaction for Optical Amplification," Pacifici et al., *Physical Review*, B 67, 245301 (2003).

"Light Transport Through the Band-Edge States of Fibonacci Quasicrystals," Dal Negro et al., *Physical Review Letters*, v. 90, n. 5 (Feb. 7, 2003).

(Continued)

*Primary Examiner*—S. V Clark
(74) *Attorney, Agent, or Firm*—Gauthier & Connors LLP

(57) ABSTRACT

A fabrication method and materials produce high quality aperiodic photonic structures. Light emission can be activated by thermal annealing post growth treatments when thin film layers of $SiO_2$ and $SiN_x$ or Si-rich oxide are used. From these aperiodic structures, that can be obtained in different vertical and planar device geometries, the presence of aperiodic order in a photonic device provides strong group velocity reduction (slow photons), enhanced light-matter interaction, light emission enhancement, gain enhancement, and/or non-linear optical properties enhancement.

11 Claims, 11 Drawing Sheets

OTHER PUBLICATIONS

"Photon Band Gap Properties and Omnidirectional Reflectance in Si/SiO2 Thue-Morse Quasicrystals," Dal Negro et al., *Applied Physics Letters*, v. 84, n. 25 (Jun. 21, 2004).

Xia et al., "Surface Brillouin scattering in semiconductor Fibonacci multilayer" The American Physical Society, vol. 42, No. 17, Dec. 15, 1990, pp. 11288-11294.

Lumholt et al., Low-Energy Erbium Implanted Si3N4/SiO2/Si Waveguides, Electronics Letters, vol. 28 No. 24, Nov. 19, 1992, pp. 2242-2243.

Peng et al., "Dimerlike positional correlation and resonant transmission of electromagnetic waves in aperiodic dielectric multilayers" The American Physical Society vol. 69, No. 16 pp. 165109.1-165109.7, 2004.

Musikhin et al., "Optical properties of quasiperiodic and aperiodic PbS-CdS superlattices" Semiconductors, Jan. 1997, vol. 31, No. 1, pp. 46-50.

Floyd et al. "Recent Results on ZnSe-Based Vertical-Cavity Surface Emitting Lasers Operating in the Blue" Phys. Srat. Sol. (b), 1995. vol. 187, pp. 355-361.

Baribeau et al., "Amorphous Si/insulator multilayers grown by vacuum deposition and electron cyclotron resonance plasma treatment" Journal of Luminescence, 1999, vol. 80 pp. 417-421.

Dal Negro et al., "Photon band gap properties and omnidirectional reflectance in Si/SiO2 Thue-Morse quasicrystals" Applied Physics Letters, 2004, vol. 84, No. 25, pp. 5186-5188.

* cited by examiner

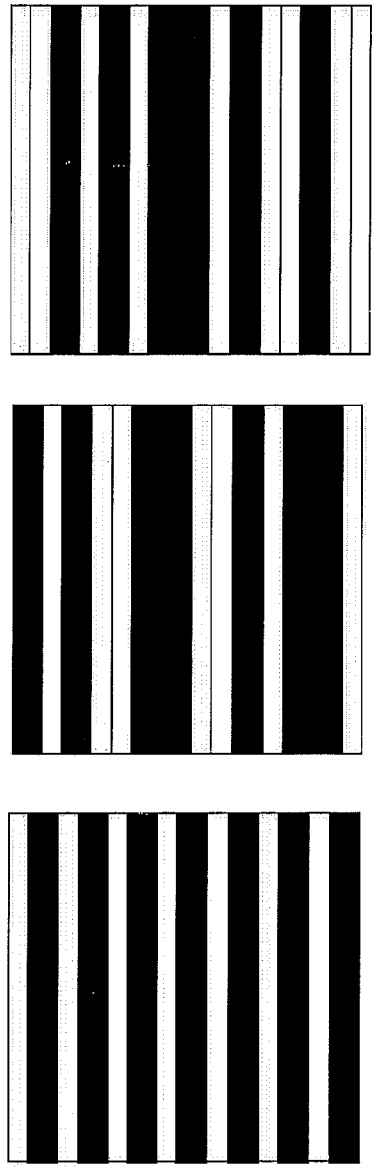
FIGURE 2

CMOS-COMPATIBLE LIGHT EMITTING APERIODIC PHOTONIC STRUCTURES

PRIORITY INFORMATION

The present patent application claims priority under 35 U.S.C. §119 from U.S. Provisional Patent Application Ser. No. 60/565,164, filed on Apr. 23, 2004; from U.S. Provisional Patent Application Ser. No. 60/564,900, filed on Apr. 23, 2004; and from U.S. Provisional Patent Application Ser. No. 60/631,041, filed on Nov. 24, 2004. The entire contents of U.S. Provisional Patent Application Ser. No. 60/565,164, filed on Apr. 23, 2004; U.S. Provisional Patent Application Ser. No. 60/564,900, filed on Apr. 23, 2004; and U.S. Provisional Patent Application Ser. No. 60/631,041, filed on Nov. 24, 2004, are hereby incorporated by reference.

GOVERNMENT RIGHTS NOTICE

The present invention was made with government support under Grant (Contract) Number, DMR 02-13282, awarded by the National Science Foundation. The US Government has certain rights to this invention.

FIELD OF THE PRESENT INVENTION

The present invention is directed to light emitting aperiodic photonic structures and the fabrication thereof. More particularly, the present invention is directed to light emitting aperiodic photonic structures that have localized light modes at multiple frequencies with associated strong field enhancement effects and the fabrication thereof.

BACKGROUND OF THE PRESENT INVENTION

Conventional multilayer-deposition approaches have produced good quality periodic photonic structures, like Fabry-Perot Microcavities and distributed Bragg mirrors. More challenging is the fabrication of high quality aperiodic structures. An example of such a photonic structure is a deterministic aperiodic structure such as the one generate by a Thue-Morse sequence. This is just an example of aperiodic photonic structures and does not limit the approach we are proposing to this specific choice.

Specifically, an aperiodic structure generated by a Thue-Morse sequence is a structure obtained by the simple inflation rule $\sigma_{T-M}$: A→AB, B→BA. Very recently the authors demonstrated omnidirectional reflectivity in a passive Thue-Morse photonic structure fabricated by a standard sputtering deposition technique. It is known theoretically that aperiodic structures show fractal distribution of sharp band-edge states with resonant transmission and strong field enhancement effect.

However, despite the big potential of aperiodic structures for enhancing light-matter interactions, no such aperiodic structures have been demonstrated combining both strong light-matter interaction and light emission. In fact, the standard materials approaches used to fabricate aperiodic photonic structures are not suited to obtain strong light emission homogeneously from all the layers constituting the structures. In other words, conventional materials used to fabricate aperiodic structures do not provide efficient light emission originating homogeneously from within the photonic structure itself.

Therefore, it is desirable to develop CMOS-compatible light emitting photonic structures that can produce efficient room temperature light emission homogeneously from the inside of photonic structure. Moreover, it is desirable to develop materials that can be used to fabricate aperiodic structures that obtain strong light-matter coupling homogeneously from all the layers constituting the structures.

SUMMARY OF THE PRESENT INVENTION

One aspect of the present invention is a method of fabricating an aperiodic multilayer structure. The method deposits a thin film layer of $SiO_2$ onto a substrate; deposits a thin film layer of $SiN_x$ upon the layer of $SiO_2$ to form a structure; and thermally anneal the structure formed by depositing the thin film layer of $SiO_2$ and the thin film layer of $SiN_x$.

Another aspect of the present invention is a coupled aperiodic structure having fractal cavities. The coupled aperiodic structure includes a plurality of aperiodic multilayers, each aperiodic multilayer being constructed of thermally annealed thin film layers of $SiO_2$ and $SiN_x$; and a dielectric spacer positioned between each aperiodic multi layer.

A third aspect of the present invention is a light emitting device. The light emitting device includes two aperiodic multilayer structures, each aperiodic multilayer structure being constructed of thermally annealed thin film layers of $SiO_2$ and $SiN_x$; and layers of rare earth atoms positioned between each aperiodic multilayer structure.

A fourth aspect of the present invention is a photonic quasicrystal planar device. The photonic quasicrystal planar device includes a channel waveguide structure with aperiodic etched trenches along a guiding direction, a core of the channel waveguide structure being constructed of thermally annealed $SiN_x$; and a low index material formed within the aperiodic etched trenches of the channel waveguide structure.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein:

FIG. 2 illustrates various vertical aperiodic structures in accordance with the concepts of the present invention;

DETAILED DESCRIPTION OF THE PRESENT INVENTION

Figure 1:
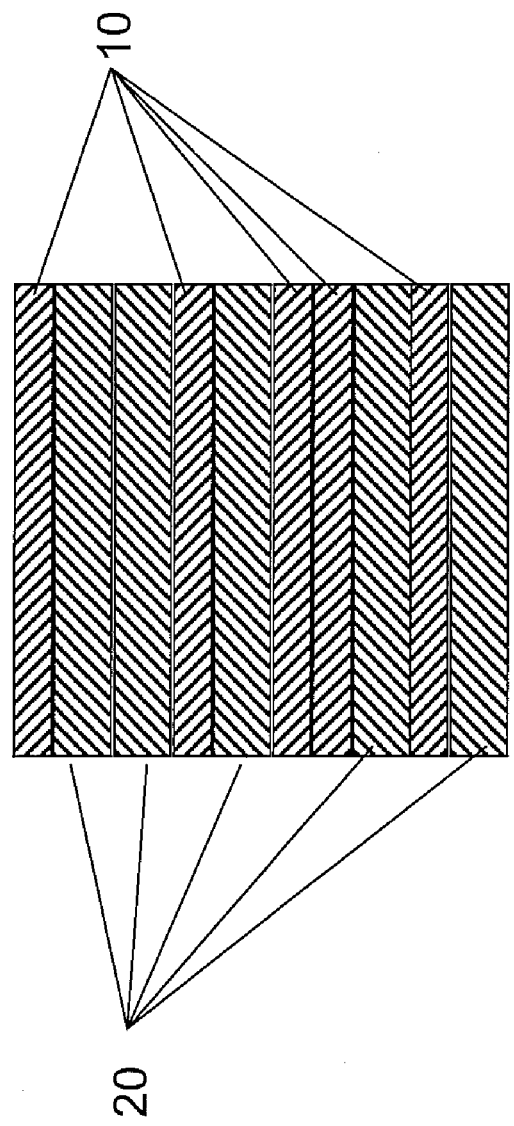
FIG. 1 is a schematic diagram of a one-dimensional aperiodic structure in accordance with the concepts of the present invention.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

As noted above, the present invention is directed to light emitting optical devices characterized by aperiodic order and strong light-matter interaction. The application fields are integrated non-linear optics, low threshold optical amplifiers, on-chip optical sensors, optical switches, and all optical delay lines based on strong light dispersion in aperiodic photonic crystals structures.

More specifically, the present invention is directed to deterministic aperiodic photonic materials (photonic quasicrystals) and structures, where critical and localized light states can trap light waves of several frequency simultaneously (multi-frequency photon localization), and the presence of narrow resonant states with high quality factors (high Q states), leads to dramatic enhancement effects in the electric field modes and to strong light dispersion effects with respect to regular photonic crystals structures.

Photonic quasicrystals are dielectric materials where the refractive index fluctuates without spatial periodicity, though the index profile is generated according to simple deterministic rules (such as the Fibonacci one: $F_{j+1}=F_j+F_{j-1}$). This class of perfectly ordered materials realizes an intermediate regime of geometrical organization between random structures and periodic ones.

Analogously to photonic band-gap materials, photonic quasicrystals can be realized by stacking together layers of different dielectric materials with thicknesses comparable to the wavelength of light. Moreover, photonic quasicrystals provide extremely complex fractal spectra, high Q resonance transmission states, localized and fractal photon states with sizeable field enhancement, and anomalous light diffusion. Lastly, photonic quasicrystals can effectively enable strong group velocity reduction (slow photons); strong light-matter interaction; light emission enhancement; gain enhancement; and/or nonlinear optical properties enhancement. As such, photonic quasicrystals can enhance the performance of light emitting devices, integrated non-linear optics, low threshold optical amplifiers, on chip optical sensors, optical switches, ultrashort optical pulse compression elements, and optical delay lines.

To fabricate the light emitting photonic, periodic photonic, and non-periodic photonic structures of the present invention, a fabrication process utilizes thin film deposition of dielectrics followed by thermal annealing treatments that activates efficient room temperature light emission. In one embodiment of the present invention, the thin film dielectrics may be $SiO_2$ and Si-rich nitride ($SiN_x$).

The fabrication process of the present invention includes the fabrication on transparent fused silica substrates through plasma enhanced chemical vapor deposition. However, the several other thin-films fabrication procedures can be utilized.

In a specific example, silicon nitride layers are deposited using $SiH_4$ and $N_2$ as precursors while oxide layers are deposited using $SiH_4$ and $N_2O$. The substrate temperature during deposition is about 400° C. In order to maximize the effect of light scattering, the thickness $d_{A,B}$ of the two materials, $SiN_x$ (layer A) and $SiO_2$ (layer B), has been chosen to satisfy the Bragg condition, $d_A n_A = d_B n_B = \lambda_0/4$, where $n_A$ (2.23) and $n_B$ (1.45) are the respective refractive indices and $\lambda_0=1.65$ μm.

Within a fully VLSI-CMOS compatible annealing window, the present invention utilizes a post-deposition annealing treatment in $N_2$ atmosphere that produces active devices with efficient light emission from the layers of the photonic structures. In addition, the present invention yields little absorption losses in the visible range and intense broad band photoluminescence.

It is noted that the luminescence band can further be tuned by deposition of oxynitride ($SiON_x$) thin films with variable stoichiometry.

Furthermore, it is noted that low temperature pre-annealing processes followed by higher temperature thermal annealing treatments in forming gas atmosphere can be utilized to control the spectral width of the emission band.

In one fabrication embodiment, various annealing treatments, ranging from 400° C. up to 1300° C. enable the fabrication of photonic structures that have a greater degree of flexibility and light emission control than structures produced by conventional fabrication processes. It is noted that the annealing time is determined according to the structure composition wherein the annealing time ranges from 1 minute to several hours. The thermal annealing post growth process activates the light emission homogeneously from the layers of the structures (interfaces).

Utilizing the fabrication process of the present invention, the aperiodic Thue-Morse photonic structures demonstrate interface quality comparable with conventionally fabricated periodic structures, allowing for the observation of complex transmission spectra with large field enhancement effects and light dispersion.

Figure 7:
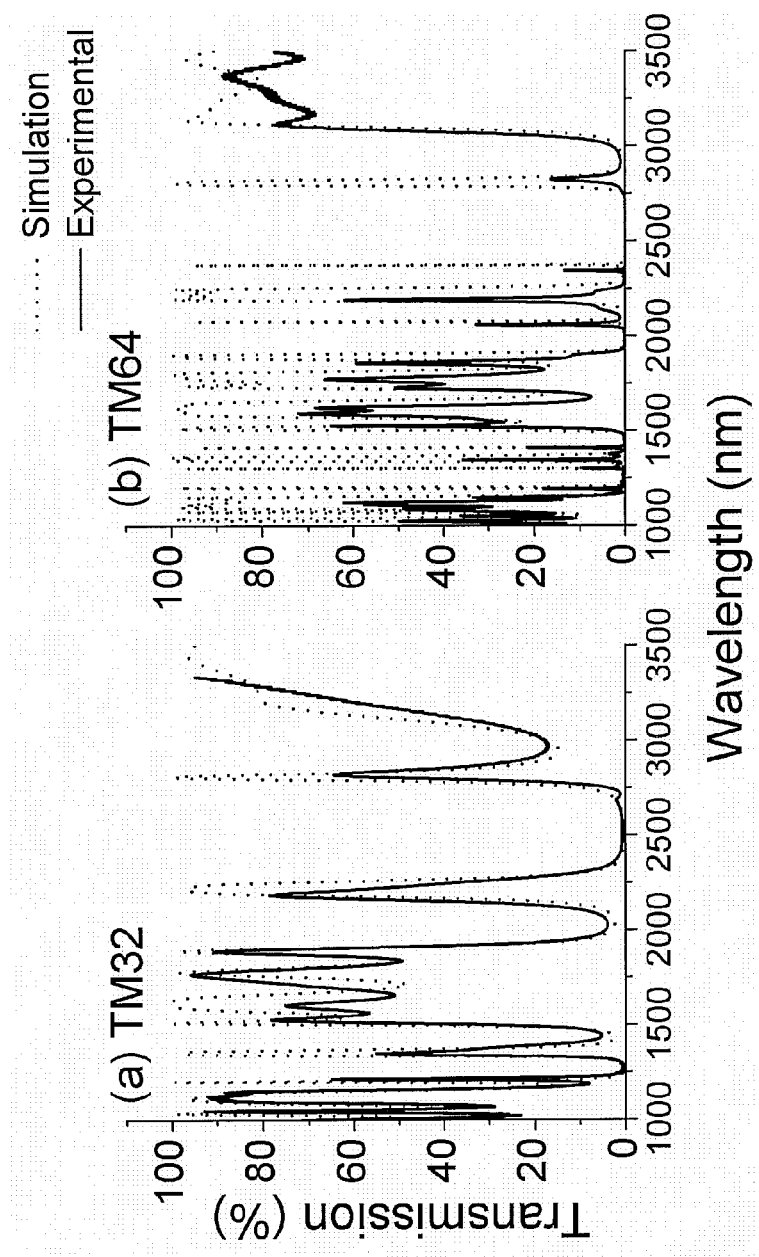
FIG. 7 graphically illustrates transmission characteristics of Thue-Morse photonic structures constructed in accordance with the concepts of the present invention.

An example of the realized improvement in absorption loss by aperiodic Thue-Morse photonic structures fabricated by the concepts of the present invention is illustrated in FIG. 7. More specifically, FIG. 7 shows the measured optical transmission spectra versus wavelength for a 32 layers photonic Thue-Morse structure fabricated by the concepts of the present invention and for a 64 layers photonic Thue-Morse structure fabricated by the concepts of the present invention.

Figure 8:
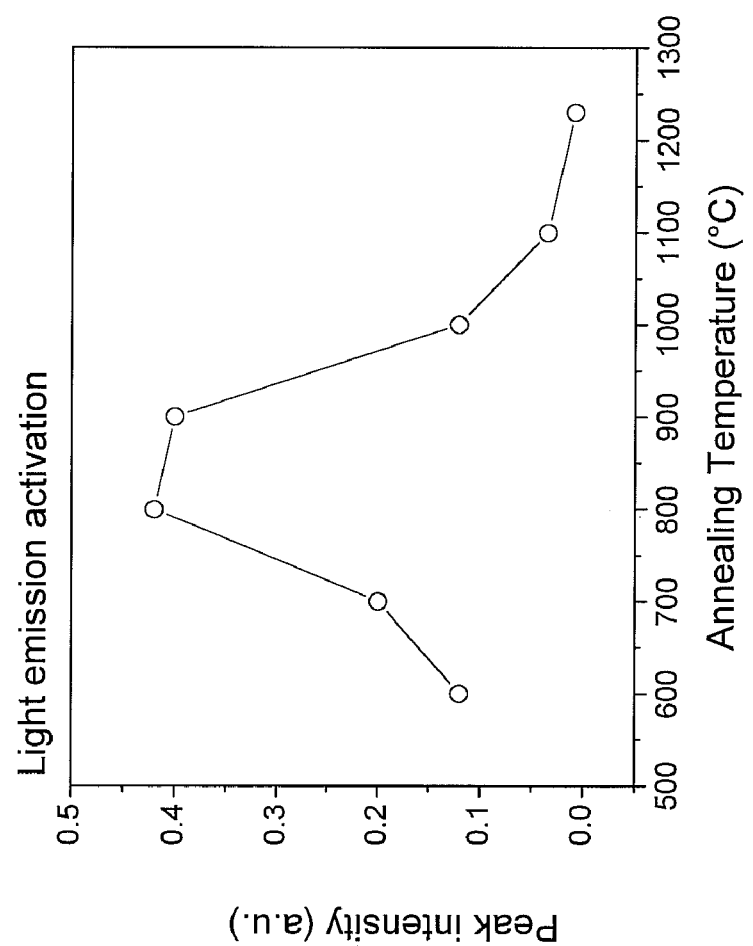
FIG. 8 graphically illustrates a relationship between emission and annealing temperatures in accordance with the concepts of the present invention.
Figure 9:
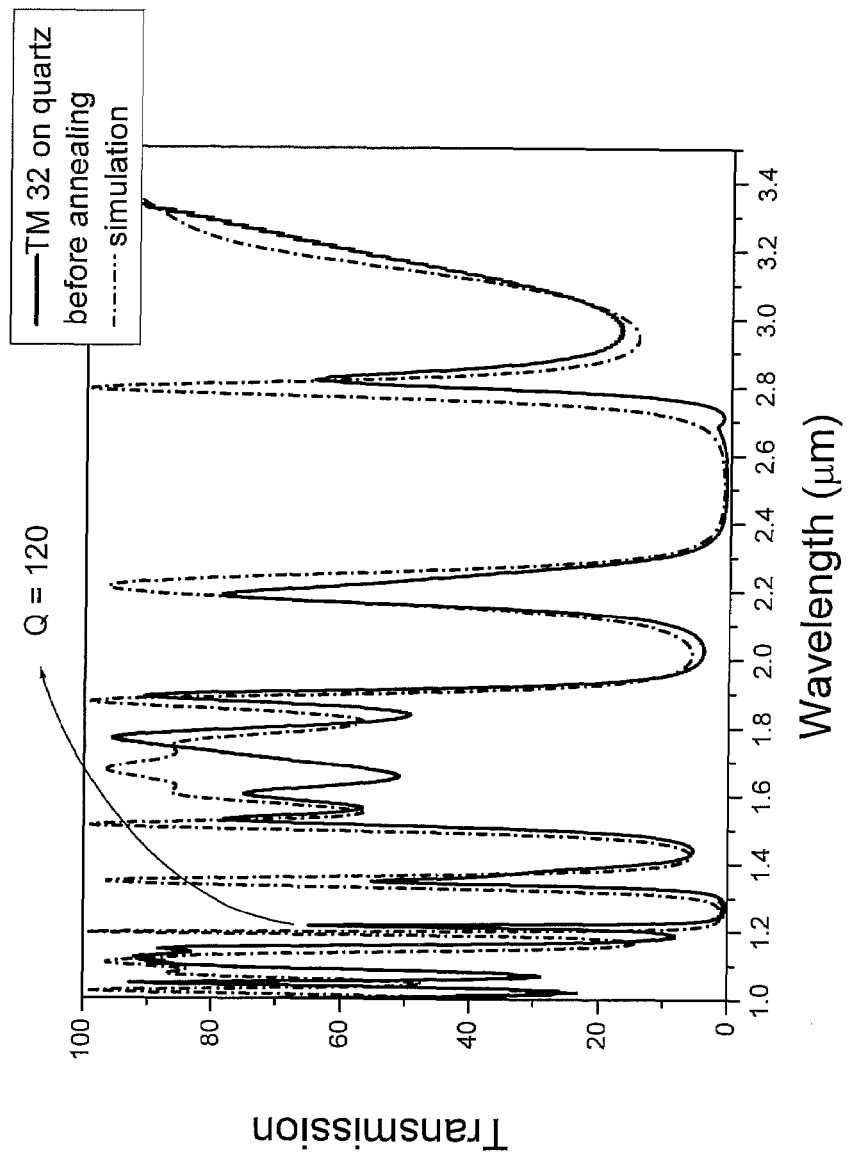
FIGS. 9 and 10 graphically illustrate transmission characteristics of multi-interfaces structures after annealing in accordance with the concepts of the present invention.
Figure 10:
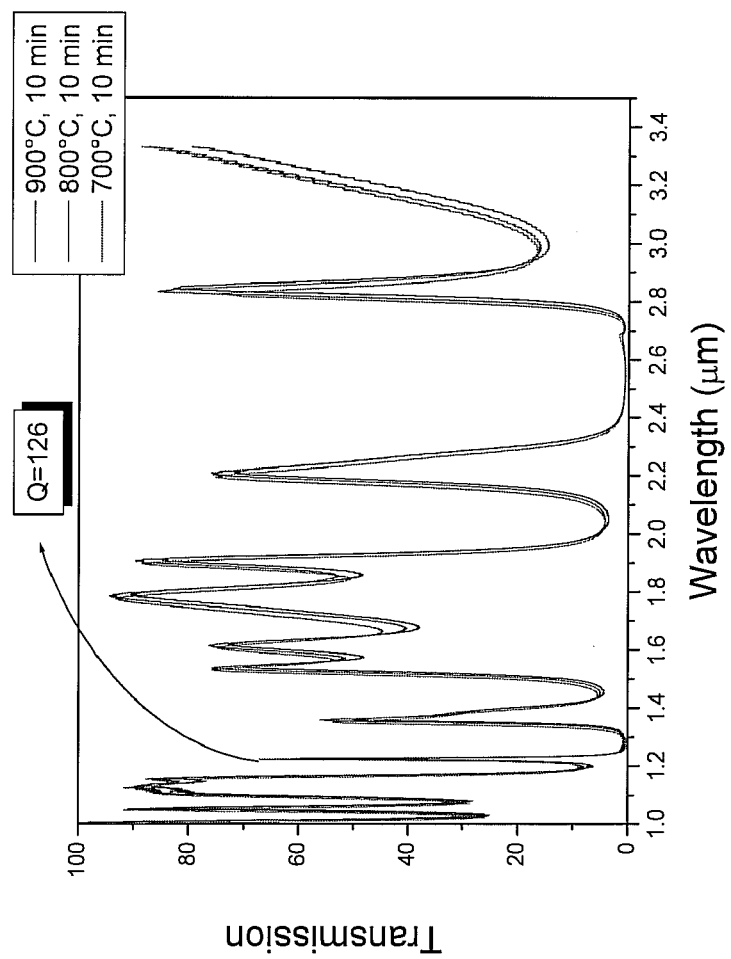

In another example of the fabrication process of the present invention, the deposited thin film dielectrics are thermal annealed, in order to activate broad band light emission from the Si-rich nitride layers. From this thermal annealing treatment, a broad emission band originating from the $SiO_2/SiN_x$ interfaces can be realized, as illustrated in FIG. 8. However, it is noted that $SiO_2/SiN_x$ multi-interfaces structures are resistant to the annealing treatments that activate the light emission from the structures, as demonstrated in FIGS. 9 and 10 and the thermal annealing steps are not compromising the photonic properties of the structures.

Figure 11:
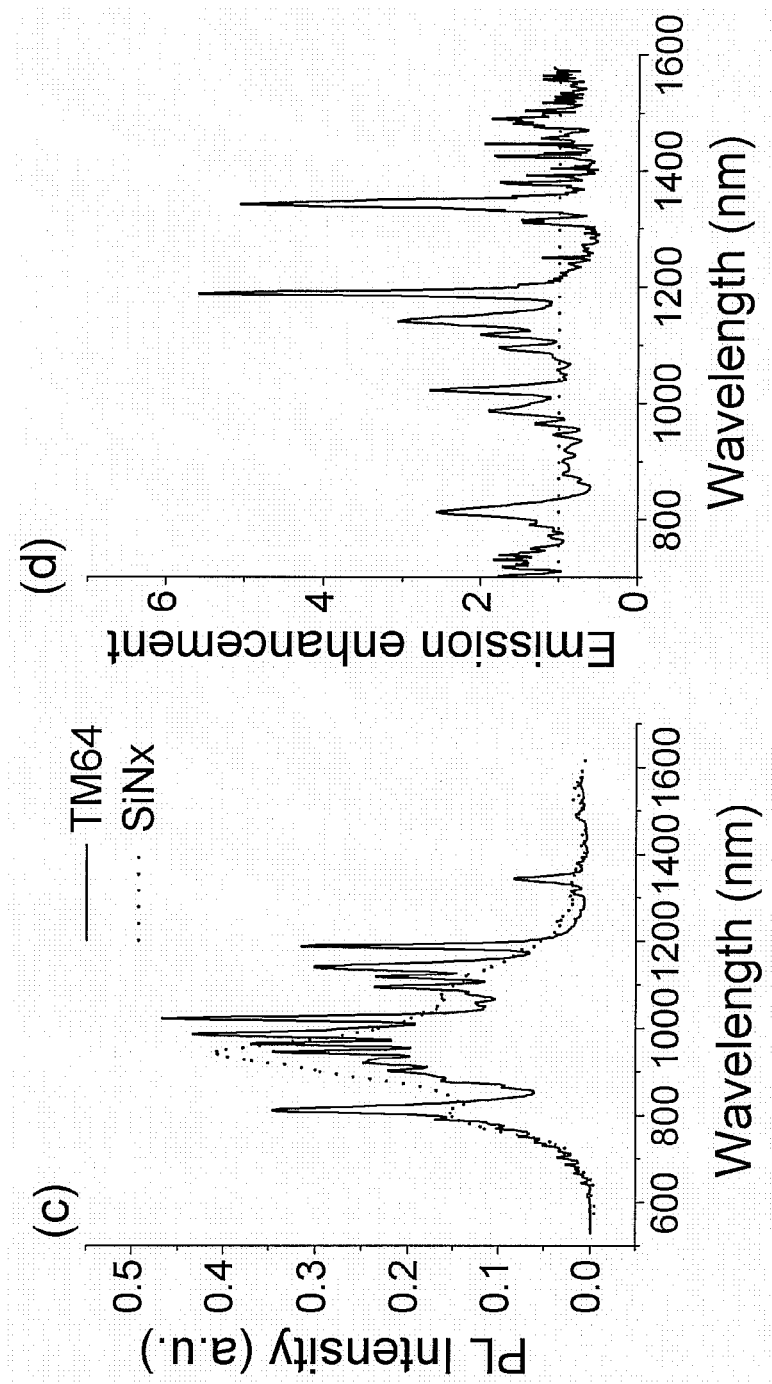
FIG. 11 graphically illustrates light emission enhancement at the resonant states in accordance with the concepts of the present invention.

The advantage of fabricating aperiodic photonic structures utilizing the concepts of the present invention is clearly shown in FIG. 11 where the broad light emission spectrum originating from the an homogeneous $SiN_x$ dielectric layer can be significantly modified and enhanced at the resonant states induced by the geometrical complexity of the aperiodic Thue-Morse structure.

More specifically, as illustrated in FIG. 11, a Thue-Morse structure fabricated utilizing the processes of the present invention can resonantly enhance the light emission efficiency of the material at several wavelengths simultaneously. It is noted that the critical light states characteristic of the Thue-Morse structure may yield an emission enhancement of approximately a factor of 6.

Moreover, it is noted that the utilization of $SiN_x$ as a high refractive index and a broad band light emitting material enables effective transfer of the excitation to rare earth atoms (for instance erbium) through energy coupling mechanisms. The emission mechanism relies on the formation of nitrogen passivated small silicon clusters dispersed in the embedding $Si_3N_4$ dielectric host, in close analogy with $Si/SiO_2$ superlattice systems. In other words, the inclusion of rare earth ions within the nitride or oxynitride structures fabricated by the processes of the present invention produces light emitting photonic structures characterized by efficient near infrared emission with a greater degree of structural flexibility.

On the other hand, the broad photoluminescence band in the multi-interface structures fabricated by the processes of the present invention provide an ideal candidate for efficient energy coupling effects with different rare earth atoms (Pd, Yb, etc) incorporated within the layers, and allows a wider emission tuneability range.

As noted above, the fabrication process of the present invention can be utilized to realize different aperiodic light emitting photonic structures schemes. The Thue-Morse generation rule is just one example of a deterministic prescription that generates a non-periodic layer sequence.

FIG. 1 illustrates an example of photonic structure by the fabrication process of the present invention. As illustrated in FIG. 1, an aperiodic one-dimensional structure includes a stack of two different layers according to aperiodic sequences; for example, Rudin-Shapiro or Thue-Morse structures. In this structure, the layer 20 is preferably $SiO_x$. Moreover, the layer 10 is preferably $SiN_x$. This layer may also be $SiON_x$ or $Si_xGe_{1-x}$.

FIG. 2 illustrates various vertical aperiodic structures that can be fabricated by the process of the present invention wherein layer A is preferably $SiO_x$, and layer B is preferably $SiN_x$ or may also be $SiON_x$ or $Si_xGe_{1-x}$. The various structures include an ordered stack, an aperiodic deterministic stack, and a random stack.

Figure 3:
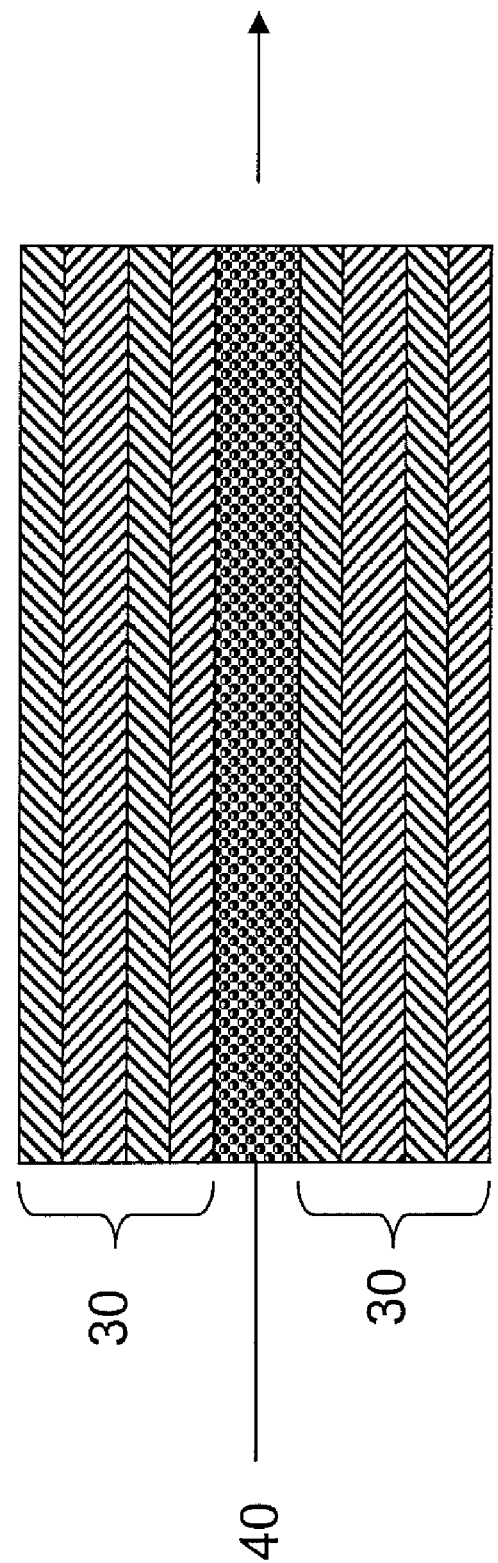
FIG. 3 illustrates a vertical aperiodic structure with an embedded emitter in accordance with the concepts of the present invention.

Another example, of photonic structure fabricated by the process of the present invention is illustrated in FIG. 3. As illustrated in FIG. 3, an active structure can be realized by using fabricating aperiodic multilayers 30 of Si-rich nitride ($SiN_x$) and Si-rich oxide ($SiO_x$). Between the aperiodic multilayers 30 of Si-rich nitride ($SiN_x$) and Si-rich oxide ($SiO_x$), a layer 40 of rare earth elements, such as Er atoms, are fabricated. This layer provides an extra active guiding layer for the emission of near infra red light around 1.55 µm. Layer 40 may also be a layer of silicon nanocrystals obtained as a result of our annealing process.

It is noted that the energy transfer phenomena from Si-rich oxide and Si-rich nitride can be effective to enhance simultaneously the Er light emission. The combination of these light emitting materials with the strong mode localization effects occurring in photonic aperiodic dielectrics like Rudin-Shapiro and Thue-Morse structures lead to enhanced light-matter coupling effects leading to high excitation efficiencies for rare earth atoms.

It is noted that aperiodic and quasi-periodic luminescent photonic structures characterized by strong light-matter coupling and enhancements effects can be realized by the fabrication process of the present invention. As such, both linear (absorption, emission) and non-linear processes (second harmonic generation, third harmonic processes, light modulation) in the structures can be enhanced as a result of the strong electric field enhancement effects and density of optical modes modifications.

In particular, Thue-Morse and Rudin-Shapiro aperiodic photonic structures can be realized by layer deposition in order to achieve efficient light emission and eventually mirrorless light amplification (fractal laser) behaviour within an enhanced light-matter coupling regime.

It is further noted that light emission at 1.55 µm can be enhanced by Er doping in the $SiO_x$ and $SiN_x$ layers of the photonic structures. Deposition methods as Plasma Enhanced Chemical Vapor Deposition and RF magnetron sputtering can be utilized. In addition, based on the aperiodic photonic crystal approach described above, both passive (non-light emitting) and active (light emitting) structures can be realized. The passive device may consist of aperiodically arranged dielectric layers of Si, $Si_3N_4$, and $SiO_2$ layers.

As noted above with respect to FIG. 1, fabricated photonic quasicrystal devices are obtained by alternating high refractive index materials like Si, Ge, $Si_xGe_{1-x}$, $Si_3N_4$, and $SiO_2$ layers using standard CMOS-compatible deposition techniques like sputtering and chemical vapor deposition. The different layers are assumed to satisfy the Bragg condition $(n_1d_1=n_2d_2=\lambda_0/4)$ around the working wavelength $\lambda_0=1.55$ µm.

It is noted that multi-frequency light emitting devices can be realized using the strongly localized light states in aperiodic multilayer structures (Thue-Morse and Rudin-Shapiro). These laser devices can operate at different frequencies corresponding to closely spaced, localized states. The underlying fractal behaviour of the transmission spectra can provide an integrated light source operating at multiple frequencies.

Figure 4:
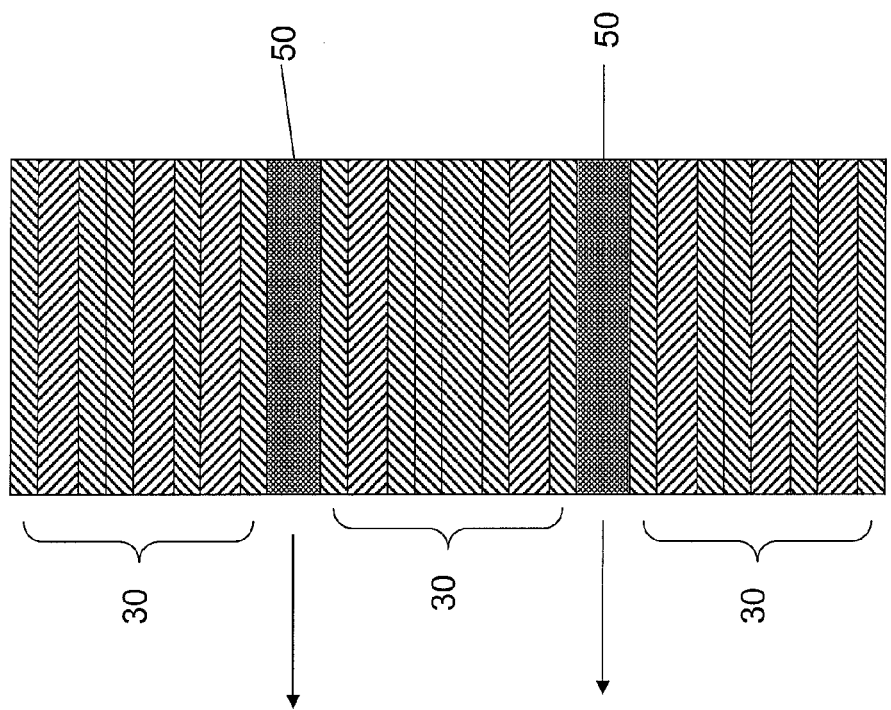
FIG. 4 illustrates coupled aperiodic structure in accordance with the concepts of the present invention.

In a further embodiment, the fabrication process can be utilized to couple together sequentially these structures through a dielectric spacer, as illustrated in FIG. 4. FIG. 4 illustrates a coupled aperiodic structure having aperiodic multilayers 30 separated by dielectric spacers 50. This structure, as illustrated in FIG. 4, enhances the mode localization (resonant enhancement of the mode density). Moreover, the structure, as illustrated in FIG. 4, realizes fractal cavities that can be used as mirrorless light amplifiers and laser devices operating at multiple wavelengths. It is noted that the aperiodic multilayers are coupled together through dielectric spacer layers.

It is noted that the strong mode coupling in these fractal coupled cavities enable the realization of THz signal modulators operating at the beating frequency of adjacent localized modes simultaneously excited by the internally generated light.

Figure 6:
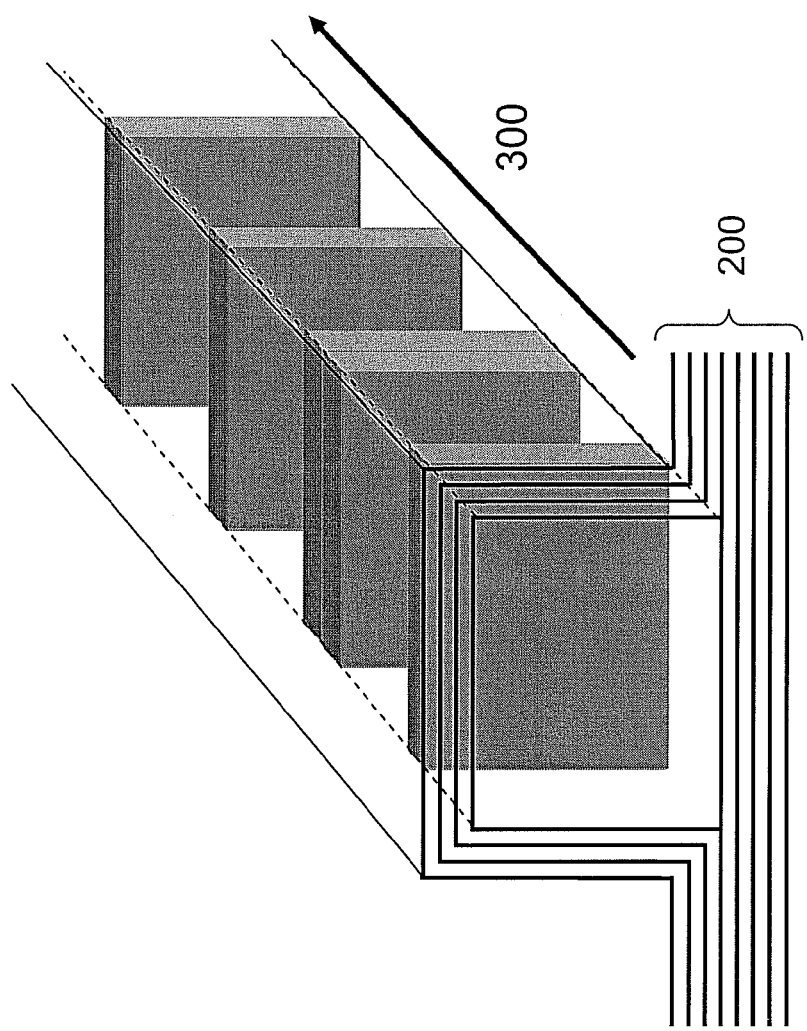
FIG. 6 illustrates an aperiodic cladding structure in accordance with the concepts of the present invention.

It is further noted that by embedding light emitting materials (Er, silicon nanocrystals) in the $SiO_2$ core of a waveguide structures with photonic quasicrystal 300 within cladding layers 200, as illustrated in FIG. 6, the intrinsic scattering losses introduced by the active inhomogeneous media (like quantum dots) can be reduced and light amplification at reduced pumping threshold can be achieved. The effect of the large photonic bandgaps in aperiodic photonic structures inhibit out of core scattering losses and strongly favor bidirectional mode amplification if an optically active medium is introduced in the low index core region.

It is noted that the present invention provides the possibility of demonstrating a light emitting device that profits from strong light-matter interaction in aperiodic material structures. The light emitting device can be realized by a proper choice of light emitting materials where light emission is activated through thermal annealing steps of the aperiodic structure. In particular, thermally annealed multilayers of $SiO_2$ and $SiN_x$, can be used or, additionally, infrared emitting rare earth atoms can be incorporated at specific locations inside the of $SiO_2$ layers of the aperiodic structures.

It is also noted that optical delay lines can be realized by using the strong localized light field inside aperiodic structures based on the strongly suppressed group velocity at the localized modes. On the other hand, strong group velocity dispersion in aperiodic structures can be utilized to implement ultrafast optical pulse compression elements.

Figure 5:
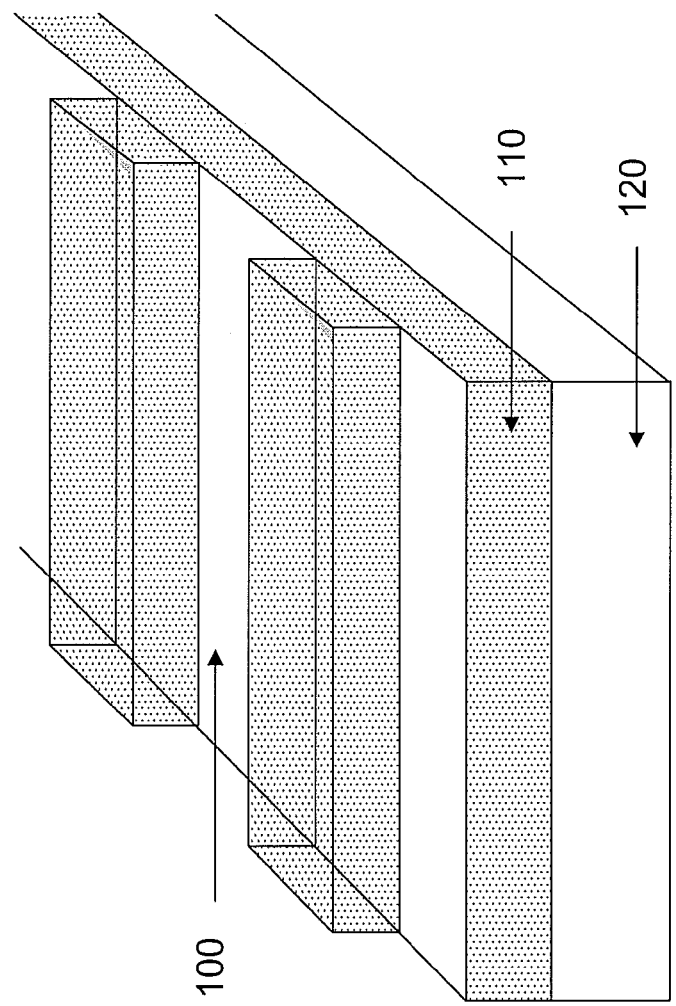
FIG. 5 illustrates a planar aperiodic waveguide in accordance with the concepts of the present invention.

Another device that can be realized by the fabrication process of the present invention is a planar aperiodic waveguide as illustrated in FIG. 5. As illustrated in FIG. 5, a photonic quasicrystal planar device is realized by etching quasiperiodic low index material trenches 100 in high index contrast material or channel waveguide structures 110 formed on a substrate 120. The low index material may be air, $SiO_2$, polymers, and/or liquid crystals. The planar aperiodic waveguide of FIG. 5 enables an extremely large light-matter interaction length within CMOS compatible planar technology.

As noted above, a photonic quasicrystal distributed grating air trench planar waveguide realizes integrated multi-frequency filters and multi wavelength light emitting components. In addition, photonic quasicrystal distributed $SiO_2$ trench grating realizes an integrated multi-frequency waveguide amplifier. The active medium (Er, silicon nanocrystals, III-V materials, dye molecules, etc.) is embedded inside the $SiO_2$ trenches Lastly, polymers, liquid crystals, or other optically active materials can be used to fill the air trenches to vary the refractive index contrast of the structure realizing a tuneability of both the gap and the localized states that can be used for sensors and optical active devices integrated in a waveguide. This structure can be obtained by standard lithographic and etching CMOS processing and can be readily integrated on a planar silicon platform. The advantages of the planar aperiodically trenched waveguides rely in the huge light-matter interaction length with respect to vertical multilayers structures.

In summary, the fabrication process of the present invention realizes photonic quasicrystal devices that provide strong group velocity reduction (slow photons), strong light-matter interaction, light emission enhancement, gain enhancement, and/or nonlinear optical properties enhancement. Moreover, a viable and flexible solution for the realization of strong photonic enhancement and localization effects in high quality periodic and aperiodic photonic structures emitting at 1.55 µm is realized by the concepts of the present invention.

The fabrication process of the present invention is entirely compatible with CMOS processes; utilizes high index (refractive index ranging from 1.6 to 2.3) material to allow flexible design of high confinements photoriic devices with strong structural stability with respect to annealing treatments; realizes broad band light emission by allowing resonant coupling with rare earth atoms and other infrared emitting quantum dots; realizes better electrical conduction properties with respect to $SiO_2$ systems; enables high transparency (low pumping and modal losses) in the visible range; and/or enables structural stability by allowing the realization of good quality light emitting complex photonic structures and photonic crystals structures.

While the present invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of fabricating an aperiodic multilayer structure, comprising:
    (a) depositing a thin film layer of $SiO_2$ onto a substrate;
    (b) depositing a thin film layer of $Si_yN_x$ upon the layer of $SiO_2$;
    (c) depositing additional layers of $SiO_2$ and layers of $Si_yN_x$ to form an aperiodic multilayer structure wherein a thickness pattern of the layers of $SiO_2$ and $Si_yN_x$ forming the aperiodic multilayer structure is aperiodic; and
    (d) thermally annealing the aperiodic multilayer structure formed by depositing the layers of $SiO_2$ and the layers of $Si_yN_x$.

2. The method as claimed in claim 1, wherein the thin film layers of $Si_yN_x$ are thin film layers of SiN.

3. The method as claimed in claim 1, wherein the thin film layers of $Si_yN_x$ are thin film layers of $Si_3N_4$.

4. The method as claimed in claim 1, further comprising:
    (e) depositing a thin film layer of $SiON_x$ prior to thermal annealing.

5. The method as claimed in claim 1, wherein the thermal annealing process includes:
    (d1) thermally annealing, at a first temperature, the aperiodic multilayer structure; and
    (d2) thermally annealing, at a second temperature, the aperiodic multilayer structure, the second temperature being greater than the first temperature.

6. A method of fabricating an aperiodic multilayer structure, comprising:
    (a) depositing a thin film layer of $SiO_2$ onto a substrate;
    (b) depositing a thin film layer of $Si_yN_x$ upon the layer of $SiO_2$;
    (c) depositing additional layers of $SiO_2$, layers of $SiN_3$, and layers of $Si_3N_4$, to form an aperiodic multilayer structure wherein a material composition pattern of the additional layers of $SiO_2$, $SiN_3$, and $Si_3N_4$ forming the aperiodic multilayer structure is aperiodic; and
    (d) thermally annealing the aperiodic multilayer structure formed by depositing the additional layers of $SiO_2$, $SiN_3$, and $Si_3N_4$.

7. The method as claimed in claim 6, further comprising:
    (e) depositing a thin film layer of $SiON_x$ prior to thermal annealing.

8. The method as claimed in claim 6, wherein the thermal annealing process includes:
    (d1) thermally annealing, at a first temperature, the aperiodic multilayer structure; and
    (d2) thermally annealing, at a second temperature, the aperiodic multilayer structure, the second temperature being greater than the first temperature.

9. A method of fabricating an aperiodic multilayer structure, comprising:
    (a) depositing a thin film layer of $SiO_2$ onto a substrate;
    (b) depositing a thin film layer of $Si_yN_x$ upon the layer of $SiO_2$;
    (c) depositing additional layers of $SiO_2$, layers of $SiN_3$, and layers of $Si_3N_4$, to form an aperiodic multilayer structure wherein both a material composition pattern of the additional layers of $SiO_2$, $SiN_3$, and $Si_3N_4$ and a thickness pattern of the additional layers of $SiO_2$, $SiN_3$, and $Si_3N_4$ forming the aperiodic multilayer structure is aperiodic; and (d) thermally annealing the aperiodic multilayer structure formed by depositing the additional layers of $SiO_2$, $SiN_3$, and $Si_3N_4$.

10. The method as claimed in claim 9, further comprising:
(e) depositing a thin film layer of $SiON_x$ prior to thermal annealing.

11. The method as claimed in claim 9, wherein the thermal annealing process includes:
  (d1) thermally annealing, at a first temperature, the aperiodic multilayer structure; and
  (d2) thermally annealing, at a second temperature, the aperiodic multilayer structure, the second temperature being greater than the first temperature.

* * * * *